(12) United States Patent  (10) Patent No.: US 6,713,347 B2
Cappelletti et al.  (45) Date of Patent: Mar. 30, 2004

(54) PROCESS FOR INTEGRATING IN A SAME CHIP A NON-VOLATILE MEMORY AND A HIGH-PERFORMANCE LOGIC CIRCUITRY

(75) Inventors: Paolo Giuseppe Cappelletti, Seveso (IT); Alfonso Maurelli, Sulbiate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/158,424

(22) Filed: May 29, 2002

(65) Prior Publication Data

US 2002/0140047 A1 Oct. 3, 2002

Related U.S. Application Data

(62) Division of application No. 09/449,044, filed on Nov. 24, 1999, now Pat. No. 6,410,387.

(30) Foreign Application Priority Data

Nov. 26, 1998 (EP) .............................. 98830709

(51) Int. Cl.⁷ ........................ H01L 29/792; H01L 27/01; H01L 29/76; H01L 21/336; H01L 21/4763
(52) U.S. Cl. ........................ 438/257; 257/324; 257/368; 257/395; 257/406; 438/201; 438/216; 438/275; 438/591
(58) Field of Search ................................ 438/216, 201, 438/275, 257, 279, 287, 591, 981; 257/324, 368, 395, 406

(56) References Cited

U.S. PATENT DOCUMENTS

| 5,182,719 A | 1/1993 | Kuroda et al. ............... 364/490 |
| 5,600,164 A | * 2/1997 | Ajika et al. .................. 257/321 |
| 5,663,084 A | 9/1997 | Yi et al. ....................... 438/453 |
| 5,668,035 A | 9/1997 | Fang et al. .................. 438/239 |

(List continued on next page.)

FOREIGN PATENT DOCUMENTS

| EP | 0 854 509 | 7/1998 |
| FR | 0591 598 | 4/1994 |
| JP | 05-021811 | 1/1993 |
| JP | 405259409 | 10/1993 |
| JP | 405347416 | 12/1993 |
| JP | 406104432 | 4/1994 |
| JP | 406151783 | 5/1994 |
| JP | 07-283322 | 10/1995 |

*Primary Examiner*—Caridad Everhart
*Assistant Examiner*—Chuong Luu
(74) *Attorney, Agent, or Firm*—Lisa K. Jorgenson; Robert Iannucci; Seed IP Law Group PLLC (57) ABSTRACT

A process for the manufacturing of an integrated circuit including a low operating voltage, high-performance logic circuitry and an embedded memory device having a high operating voltage higher than the low operating voltage of the logic circuitry, providing for: on first portions of a semiconductor substrate, forming a first gate oxide layer for first transistors operating at the high operating voltage; on second portions of the semiconductor substrate, forming a second gate oxide layer for memory cells of the memory device; on the first and second gate oxide layers, forming from a first polysilicon layer gate electrodes for the first transistors, and floating-gate electrodes for the memory cells; forming over the floating-gate electrodes of the memory cells a dielectric layer; on third portions of the semiconductor substrate, forming a third gate oxide layer for second transistors operating at the low operating voltage; on the dielectric layer and on the third portions of the semiconductor substrate, forming from a second polysilicon layer control gate electrodes for the memory cells, and gate electrodes for the second transistors; in the first portions of the semiconductor substrate, forming source and drain regions for the first transistors; in the second portions of the semiconductor substrate, forming source and drain regions for the memory cells; in the third portions of the semiconductor substrate, forming source and drain regions for the second transistors.

16 Claims, 10 Drawing Sheets

U.S. PATENT DOCUMENTS

| | | | |
|---|---|---|---|
| 5,768,194 A | 6/1998 | Matsubara et al. | 365/185.33 |
| 5,834,352 A | 11/1998 | Choi | 438/275 |
| 5,861,347 A * | 1/1999 | Maiti et al. | 438/787 |
| 5,888,869 A * | 3/1999 | Cho et al. | 438/258 |
| 5,910,016 A | 6/1999 | Kazerounian et al. | 438/258 |
| 5,926,729 A | 7/1999 | Tsai et al. | 438/591 |
| 5,989,948 A | 11/1999 | Vines et al. | 438/216 |
| 6,017,797 A | 1/2000 | Furukawa | 438/275 |
| 6,087,225 A | 7/2000 | Bronner et al. | 438/275 |
| 6,133,164 A | 10/2000 | Kim | 438/981 |
| 6,165,849 A | 12/2000 | An et al. | 438/275 |
| 6,165,918 A | 12/2000 | Jia et al. | 438/981 |
| 6,228,721 B1 | 5/2001 | Yu | 438/275 |
| 6,261,978 B1 | 7/2001 | Chen et al. | 438/981 |

\* cited by examiner

PROCESS FOR INTEGRATING IN A SAME CHIP A NON-VOLATILE MEMORY AND A HIGH-PERFORMANCE LOGIC CIRCUITRY

CROSS-REFERENCE TO RELATED APPLICATION

This application is a divisional of U.S. patent application Ser. No. 09/449,044 filed on Nov. 24, 2001, now U.S. Pat. No. 6,410,387 which is incorporated herein by reference in its entirety.

BACKGROUND OF THE INVENTION

1. Field of the Invention

The present invention relates to a process for integrating in a same chip a non-volatile memory and a high-performance circuitry.

2. Description of the Related Art

The evolution of integration technologies aiming at the formation of whole electronic systems or subsystems on a single semiconductor chip involves the capability of combining a logic circuitry with memories having a high degree of complexity.

In particular there is an increasing demand for the integration of non-volatile memories, particularly of the Flash EEPROM type, in CMOS manufacturing processes for logic circuitries of high performance.

This kind of combination becomes more and more difficult, from a technical viewpoint, due to the different requirements in terms of operating voltages.

The natural evolution of CMOS processes for high-performance logic circuitries is leading to a reduction of the operating voltage so to allow scaling of transistors' size; the shrinking and operating voltage reduction determine a corresponding reduction of the transistors' gate oxide thickness and junction depth.

On the other hand, non-volatile memories require relatively high programming voltages, and the values of such voltages are not expected to significantly decrease in the coming future, at least as far as floating-gate non-volatile memories are concerned.

Considering by way of example a 0.25 $\mu$m technology, transistors obtained by means of a CMOS process devised for high-performance logic circuitries are optimized for operating in a voltage supply value range of 0.9–2.5 V; these transistors have a gate oxide approximately 5 nm thick, and source/drain junctions capable of withstanding a voltage not higher than 8–10 V.

On the contrary, a Flash EEPROM memory requires a programming voltage in the range of 10–12 V (the programming voltage is even higher for other kinds of non-volatile memories); transistors capable of withstanding these voltages must have gate oxides with a thickness in the range 15–18 nm, and source/drain junctions with a breakdown voltage higher than the programming voltage.

It is not easy to conciliate these contrasting needs. From the one hand, any attempt to modify the structure of the transistors of an advanced CMOS process to make them capable of withstanding the relatively high voltages required by non-volatile memories results in an unacceptable degradation of the performance of the logic circuitry. On the contrary, the complete duplication of the peripheral structures for obtaining both high-performance CMOS transistors and transistors capable of sustaining high voltages greatly increases the number of masks of the manufacturing process.

A process for the manufacturing of Flash EEPROM memories of relatively high density (i.e., greater than 256–512 Kbits) requires two polycrystalline silicon layers, the lower one ("first poly") used for forming the floating gates of the memory cells, the upper one ("second poly") used for forming both the control gates of the memory cells and the gates of transistors. This process additionally requires at least two different thin oxide layers: one, with thickness of about 10 nm, is formed between the substrate surface and the lower polysilicon layer, works as a gate oxide for the memory cells; the other one, with thickness higher than 15 nm, is formed between the substrate and the upper polysilicon layer and forms the gate oxide of the transistors.

In some manufacturing processes, in order to improve the memory device performance at low voltages, transistors with a thin gate oxide (7–10 nm) are also provided; such transistors have a gate electrode formed from the second poly. However, in order to minimize the required number of additional masks, these transistors with thin gate oxide shares several structural elements with the transistors of thicker gate oxide for handling the relatively high voltages.

When it is desired to integrate a non-volatile memory, for example a Flash EEPROM memory, by means of advanced CMOS manufacturing processes, the features of the high-performance transistors must be preserved. To do this, the high-performance transistors cannot share common structural elements with the transistors for handling the relatively high voltages required by the memory cells. So, it is not sufficient to provide for the formation of two different gate oxides, and one or two masks for adjusting the threshold voltages. Extra masks would be needed to provide ad-hoc high-voltage source and drain junctions for high voltage transistors, and then the number of additional masks could easily become excessively high.

BRIEF SUMMARY OF THE INVENTION

In view of the state of the art described, it is an object of the present invention that of providing a process for integrating in a same chip a non-volatile memory and a high-performance logic circuitry.

According to an embodiment of the present invention, this object has been achieved by means of a process for the manufacturing of an integrated circuit including a low operating voltage, high-performance logic circuitry and an embedded memory device having a high operating voltage higher than said low operating voltage of the logic circuitry. The process includes:

on first portions of a semiconductor substrate, forming a first gate oxide layer for first transistors operating at said high operating voltage;

on second portions of the semiconductor substrate, forming a second gate oxide layer for memory cells of the memory device;

on said first and second gate oxide layers, forming from a first polysilicon layer gate electrodes for the first transistors, and floating-gate electrodes for the memory cells;

forming over the floating-gate electrodes of the memory cells a dielectric layer;

on third portions of the semiconductor substrate, forming a third gate oxide layer for second transistors operating at said low operating voltage;

on the dielectric layer and on said third portions of the semiconductor substrate, forming from a second polysilicon layer control gate electrodes for the memory cells, and gate electrode for the second transistors;

in said first portions of the semiconductor substrate, forming source and drain regions for the first transistors;

in said second portions of the semiconductor substrate, forming source and drain regions for the memory cells;

in said third portions of the semiconductor substrate, forming source and drain regions for the second transistors.

BRIEF DESCRIPTION OF THE SEVERAL VIEWS OF THE DRAWING(S)

The features and advantages of the present invention will now be made apparent by the following detailed description of one embodiment thereof, illustrated by way of a non-limiting example only in the annexed drawings, wherein.

DETAILED DESCRIPTION OF THE INVENTION

Figure 1:
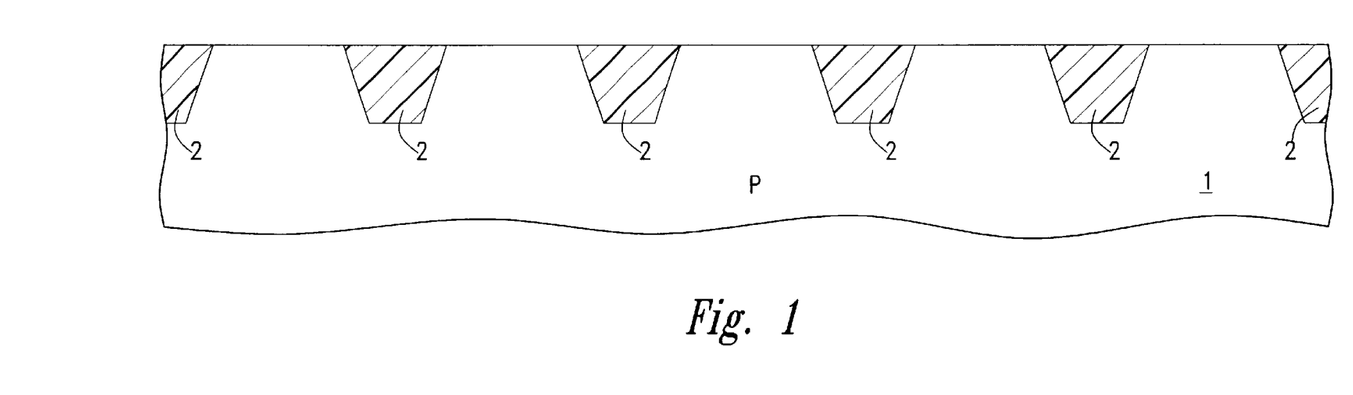
FIGS. 1 to 20 are cross-sectional views showing the relevant steps of a manufacturing process according to the present invention.

With reference to the drawings, starting from a semiconductor substrate 1, for example of P type, thick oxide isolation regions 2 are formed over the substrate. By way of example, the isolation regions 2 can be shallow trenches filled in with oxide.

If desired, at this stage a dopant can be implanted into the substrate 2 to form buried wells for the memory cells. This is for example the case of triple-well Flash EEPROM memories.

Figure 2:
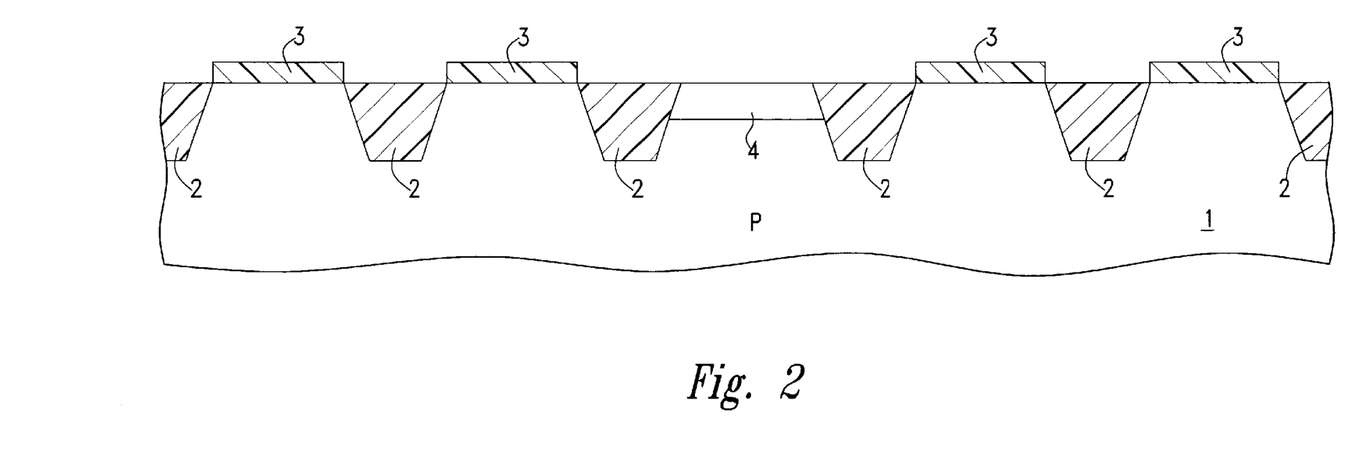

Then an oxide layer 3 is formed over the surface of the substrate 1. Oxide layer 3, having a thickness of 100–200 Å, will form the gate oxide for the high-voltage transistors, i.e., those transistors which shall handle the high voltages required by the memory cells. After having formed the oxide layer 3, a mask is applied to the substrate surface, and a P type dopant, typically boron in a dose of $1 \times 10^{12}$–$1 \times 10^{13}$ at/cm$^2$, is selectively implanted in the region of the substrate 1 where the memory cells are to be formed. This implant is used to adjust the threshold voltage of the memory cells. By means of the same mask, the oxide layer 3 is selectively removed from the region of the substrate 1 where the memory cells are to be formed. After this steps, the structure is that shown in FIG. 2, where 4 is a region wherein the dopant for cells' threshold voltage adjustment has been introduced and from the surface of which the oxide layer 3 has been removed.

Figure 3:
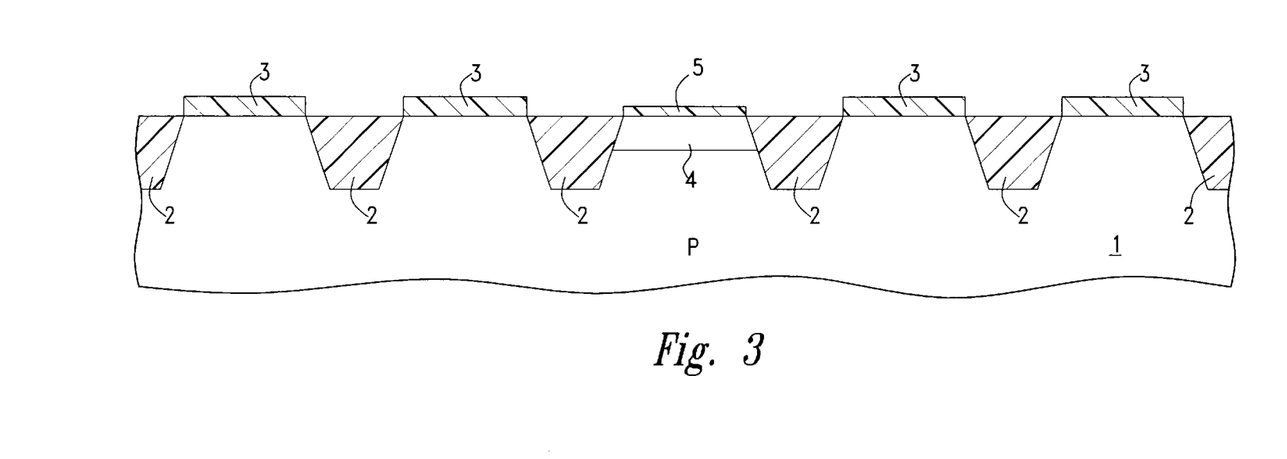

Then, as shown in FIG. 3, an oxide layer 5 thinner than oxide layer 3 is formed over region 4. Oxide layer 5 has a typical thickness of 70–110 Å and will act as a gate oxide for the memory cell (tunnel oxide in the particular case of EEPROM or Flash EEPROM memory cells).

Figure 4:
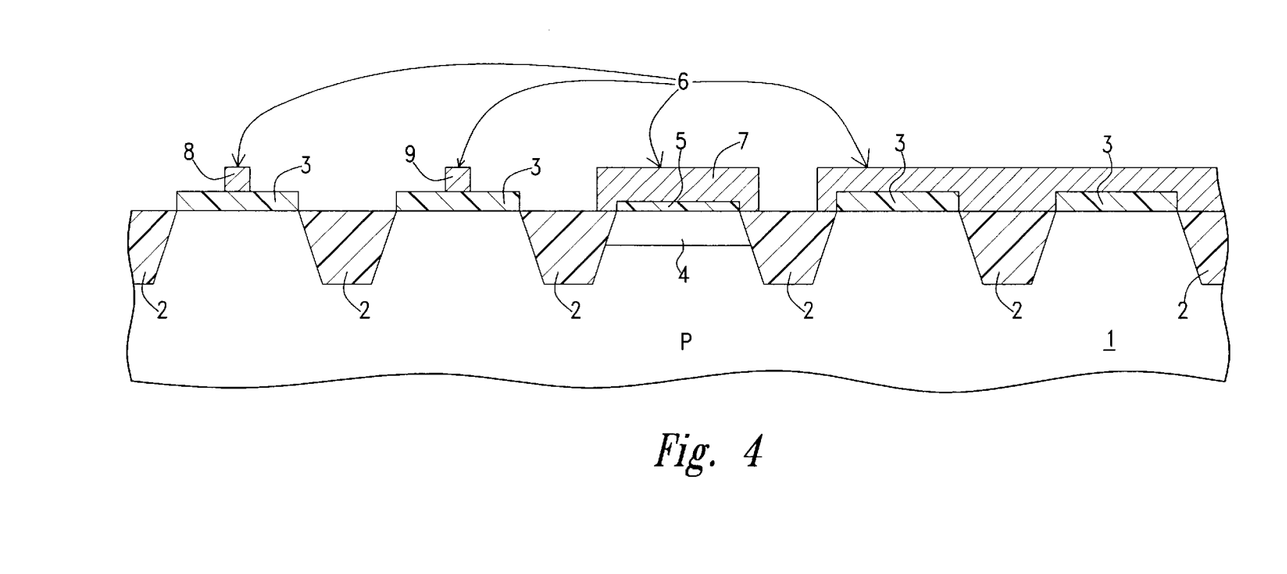

Then, a first polysilicon layer 6 is deposited over the surface of the chip. A mask is then applied and the first polysilicon layer is then selectively etched to define floating gates 7 for the memory cells. At the same time, gate electrodes 8, 9 for the high-voltage transistors are defined in the first polysilicon layer 6. The first polysilicon layer 6 is also left over the regions of the substrate 2 wherein low-voltage, high-performance transistors for the logic circuitry are to be formed. After this step, the structure is that shown in FIG. 4.

Figure 5:
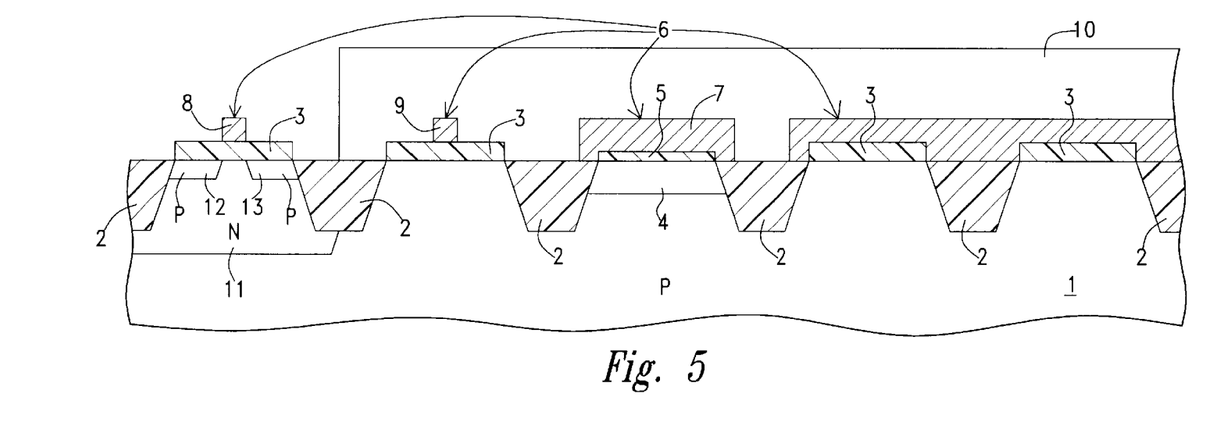

Then, a mask 10 is applied and an N type dopant, typically phosphorus, is selectively implanted in a dose of $1$–$5 \times 10^{12}$ at/cm$^2$ form N type wells 11 for containing P-channel high-voltage transistors. If necessary or desired, a further implant can be performed for the adjustment of the threshold voltage of the P-channel high-voltage transistors. These implants must be carried out at an energy sufficient to make the dopants penetrate under the oxide layer 3 and polysilicon gate 8. Suitable implantation energies are 150–250 KeV and 250–400 KeV.

By means of the same mask 10, a P type dopant, typically $BF_2$ is implanted into the N type wells 11 in a dose of $1 \times 10^{13}$–$1 \times 10^{14}$ at/cm$^2$, to form lightly doped source and drain regions 12, 13 of the P-channel high-voltage transistors, at the side of the gate electrode 8. This implant is performed at a lower energy compared to the previous implant(s), not to make the P type dopant penetrate under the gate electrode 8. A suitable energy is 30–70 KeV. After these steps, the structure is that shown in FIG. 5.

Mask 10 is then removed.

Figure 6:
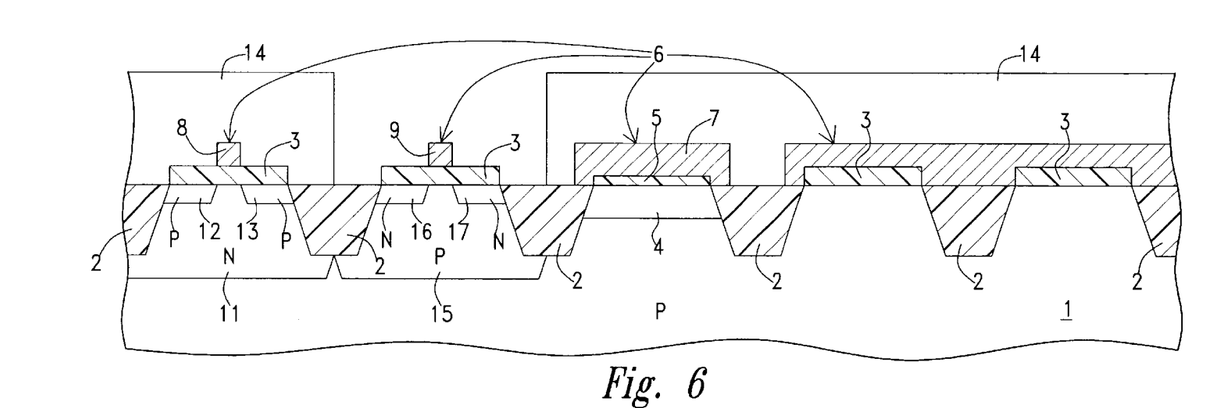

A similar mask 14 is then applied. Mask 14 covers the regions of the chip where the P-channel high-voltage transistors, the memory cells and the low-voltage, high-performance transistors of the logic circuitry are to be integrated. Using mask 14, a P type dopant such as B is then selectively implanted into substrate 2 to form P type wells 15 for the N-channel high-voltage transistors. A suitable dose is for example $1 \times 10^{12}$–$1 \times 10^{13}$ at/cm$^2$ and a suitable implantation energy is 150–300 KeV.

By means of the same mask 14, an N type dopant such as P is implanted into the P type wells 15 in a dose of $1 \times 10^{13}$–$1 \times 10^{14}$ at/cm$^2$ and at an energy of 50–100 KeV to form lightly doped N type source and drain regions 16, 17 for the N-channel high-voltage transistors.

After these steps the structure is that shown in FIG. 6.

Figure 7:
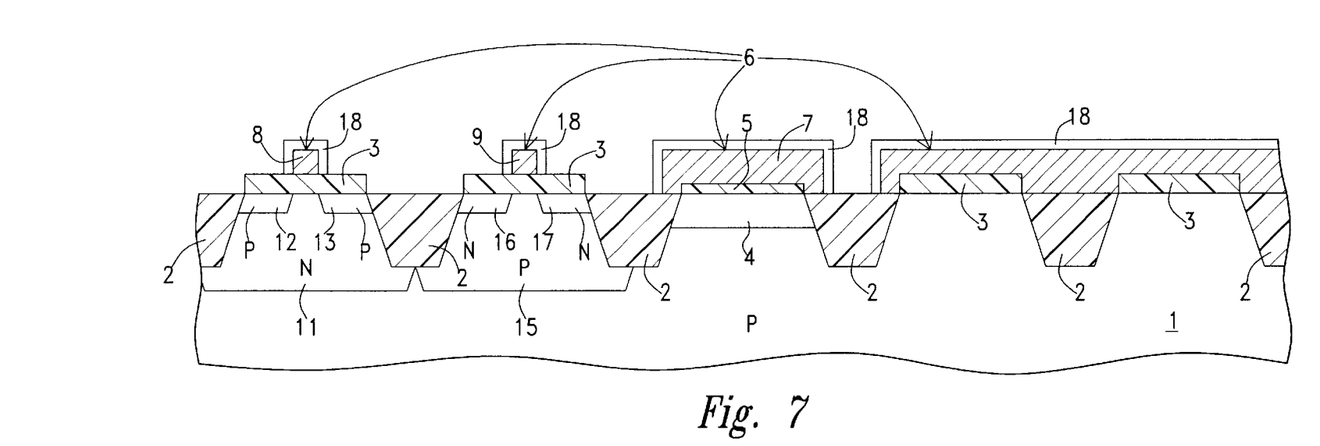

Then, as shown in FIG. 7, a dielectric layer 18 is deposited over the surface of the chip. Preferably, dielectric layer 18 is a triple layer of oxide-nitride-oxide.

Figure 8:
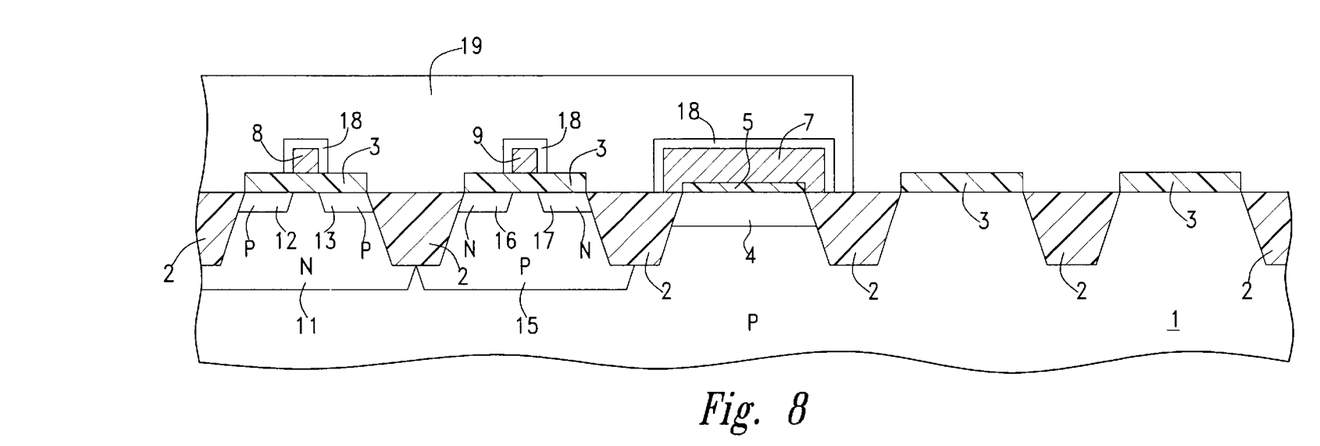

Afterwards, a mask 19 is applied to the chip. Mask 19 covers the regions of the chip wherein the memory cells and the high-voltage transistors are to be integrated. Mask 19 leaves uncovered the regions of the chip wherein low-voltage high-performance transistors of the logic circuitry are to be integrated. This mask is normally provided in manufacturing processes for floating-gate memories; conventionally, this masks only covers the regions of the chip for the floating-gate memory cells, leaving all the remaining of the chip surface uncovered. According to this invention, the mask also covers the regions for the high-voltage transistors.

Then, using the above mask, an etching process is carried out to selectively etch and remove the dielectric layer 18 and the first polysilicon layer 6 from the region of the chip dedicated to the low-voltage high-performance transistors of the logic circuitry.

After these steps, the resulting structure is that shown in FIG. 8.

Mask 19 is subsequently removed.

Figure 9:
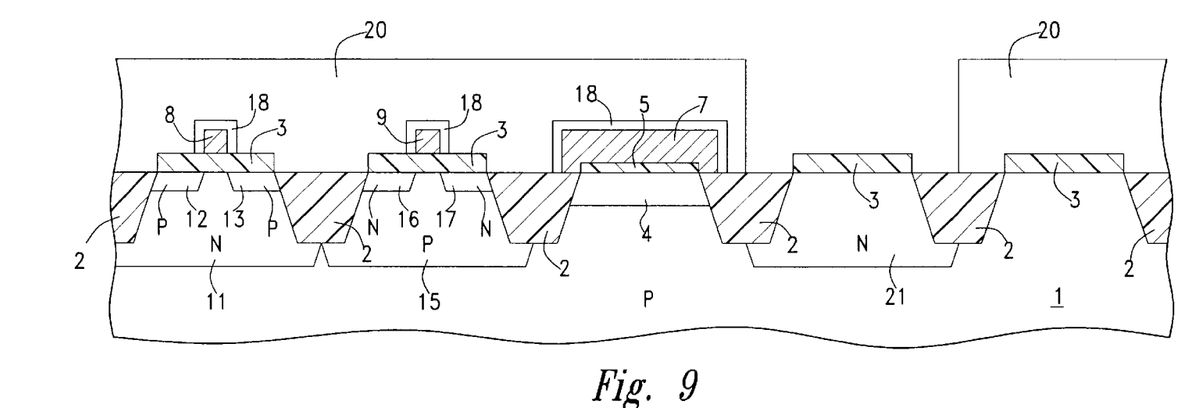

As shown in FIG. 9, a mask 20 is applied to the chip. Mask 20 covers the regions dedicated to the memory cells and the high-voltage transistors, as well as regions of the chip dedicated to the integration of N-channel low-voltage transistors for the logic circuitry. Mask 20 leaves uncovered the regions of the chip dedicated to P-channel low-voltage transistors of the logic circuitry. An N type dopant, such as P, is then selectively implanted in a sequence of implantation steps into the substrate 2 using mask 20 to form an N type well 21 for the low-voltage P-channel transistors. Suitable implantation dose and energies are $1\times10^{12}$–$1\times10^{13}$ at/cm$^2$ and 50–500 KeV depending on the kind of implant.

Figure 10:
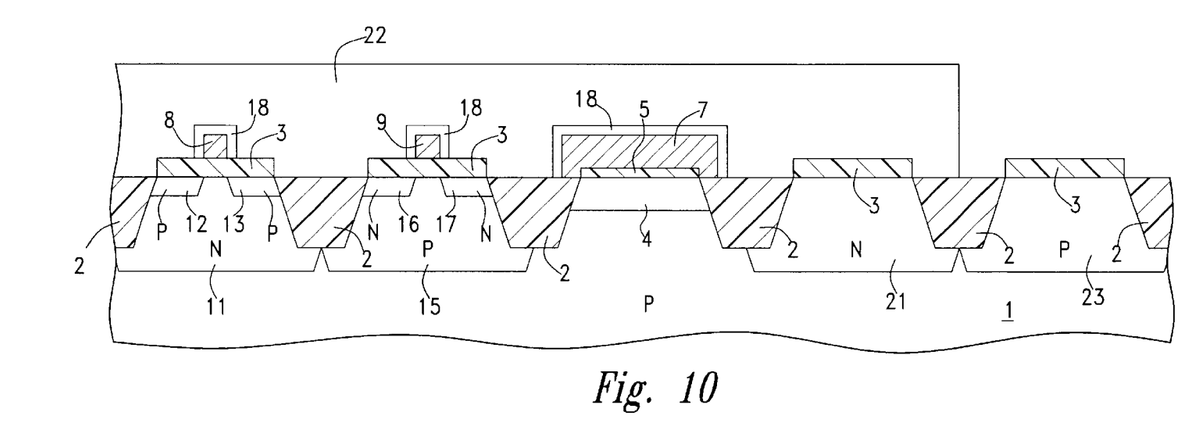

Mask 20 is then removed. As shown in FIG. 10, a complementary mask 22 is applied to the chip. A P type dopant such as B is then implanted in a sequence of implantation steps into the substrate 2 to form P type well 23 for the low-voltage N-channel transistors of the logic circuitry. Suitable implantation dose and energies are $1\times10^{12}$–$1\times10^{13}$ at/cm$^2$ and 30–300 KeV.

Figure 11:
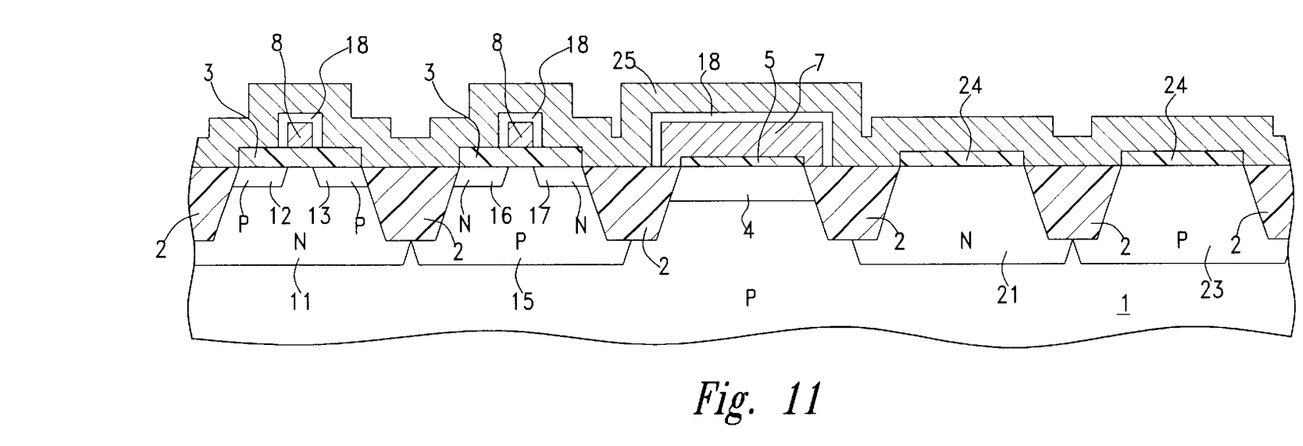

Then, the oxide layer 3 is removed from the regions of the chip dedicated to the low-voltage high-performance transistors of the logic circuitry, and a further gate oxide layer 24 is grown over the substrate 2 in such regions, i.e., over the N type and P type wells 21, 23. Gate oxide 24 has a preferable thickness of 40–60 Å.

A second polysilicon layer 25 is then deposited over the whole surface of the chip.

After these steps, the resulting structure is that shown in FIG. 11.

Figure 12:
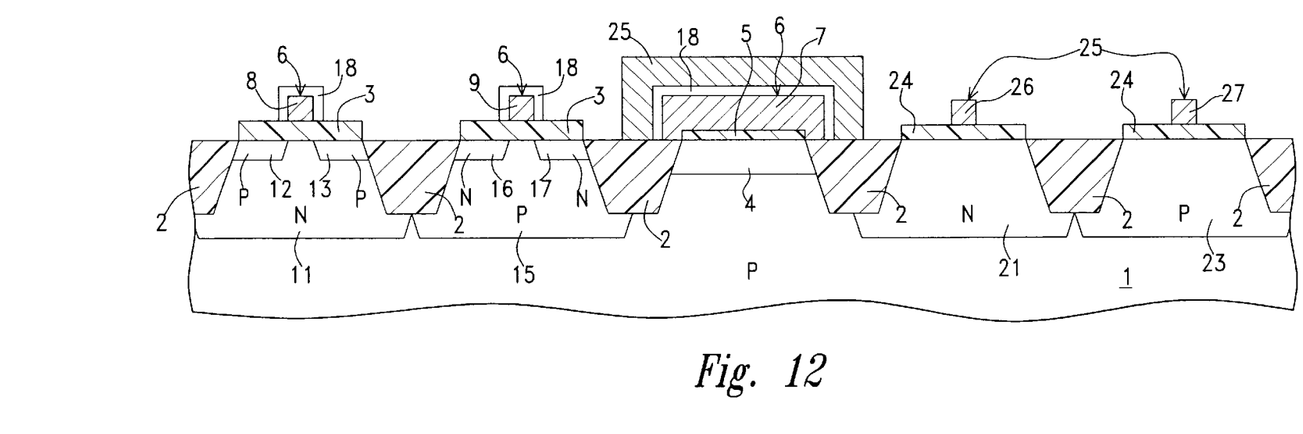

The second polysilicon layer 25 is then submitted to a first selective etching, to define gate electrodes 26, 27 for the low-voltage N- and P-channel transistors of the logic circuitry. During this etching, the second polysilicon layer 25 is not removed from the region of the chip dedicated to the memory cells. That means that the second polysilicon layer is removed from the high-voltage transistors. The resulting structure is shown in FIG. 12.

Figure 13:
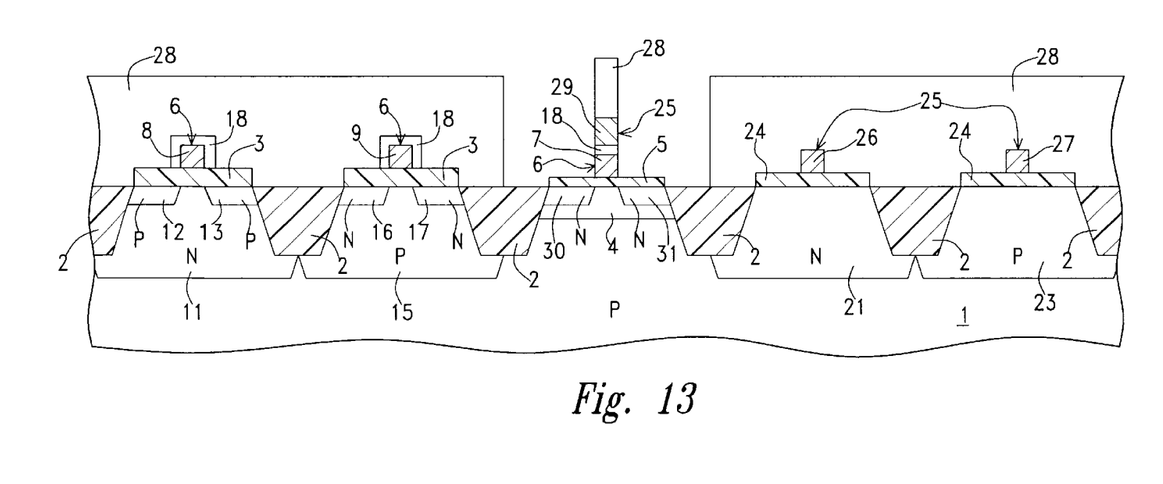

Then, a mask 28 is applied to the chip, as shown in FIG. 13. Mask 28 covers the regions of the chip dedicated to the high-voltage transistors, as well as the regions of the chip dedicated to the low-voltage transistors. Mask 28 also covers portions of the region dedicated to the floating-gate memory cells.

Using mask 28, a selective etching is carried out to remove the second polysilicon layer 25 and thus define control gate electrodes 29 of the memory cells. The etching process also provides for the self-aligned etching of the dielectric layer 18 and the first polysilicon layer 6, thus completely defining the gate structure of the memory cells.

Using the same mask 28, an N type dopant such as As is implanted into region 4 to form source and drain regions 30, 31 of the memory cells. Suitable implant dose and energy are $1$–$5\times10^{15}$ at/cm$^2$ and 40–100 KeV.

After these steps, the resulting structure is that shown in FIG. 13.

Figure 14:
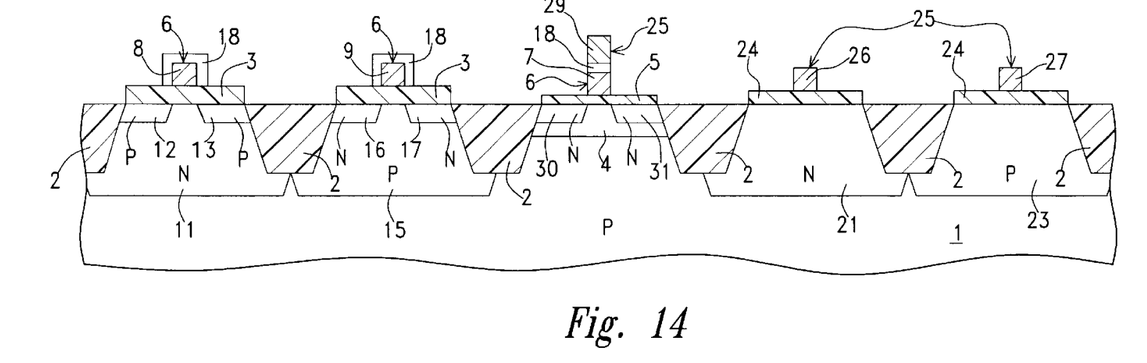

Mask 28 is then removed. Preferably, a reoxidation of the source and drain regions is performed at this stage. The resulting structure is that shown in FIG. 14.

Figure 15:
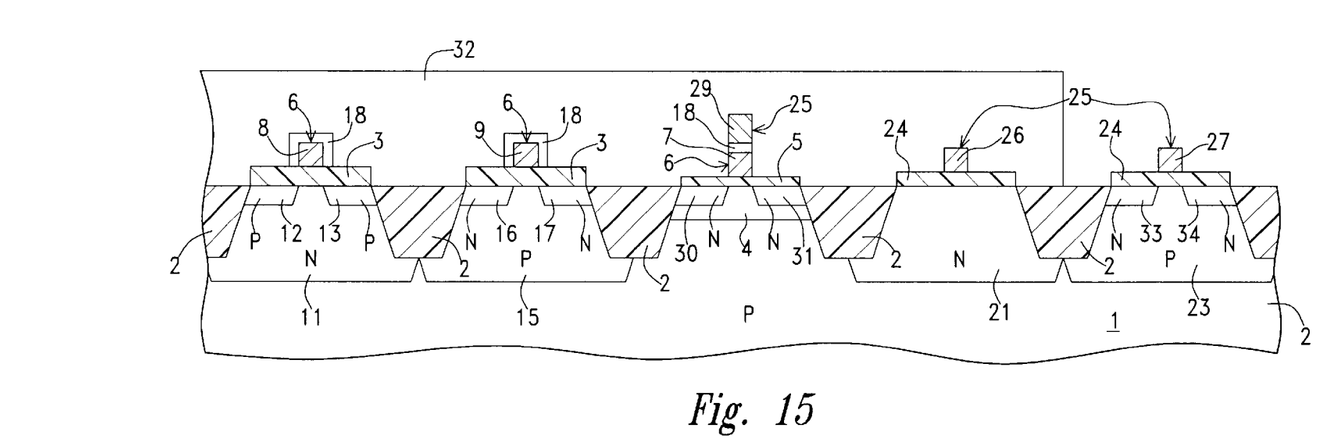

A mask 32 is then applied to the chip. Mask 32 leaves uncovered the regions of the chip dedicated to the N-channel low-voltage transistors of the circuitry. Using mask 32 an N type dopant such as P or As is implanted into the low-voltage P type wells 23 to form lightly doped source and drain regions 33, 34 (Lightly-Doped Drain or LDD regions) for the low-voltage N-channel transistors of the circuitry. Suitable dose and energy are $1\times10^{13}$–$1\times10^{14}$ at/cm$^2$ (for both P and As) and 40–70 KeV for P, or 70–120 KeV for As.

After these steps, the resulting structure is that shown in FIG. 15.

Figure 16:
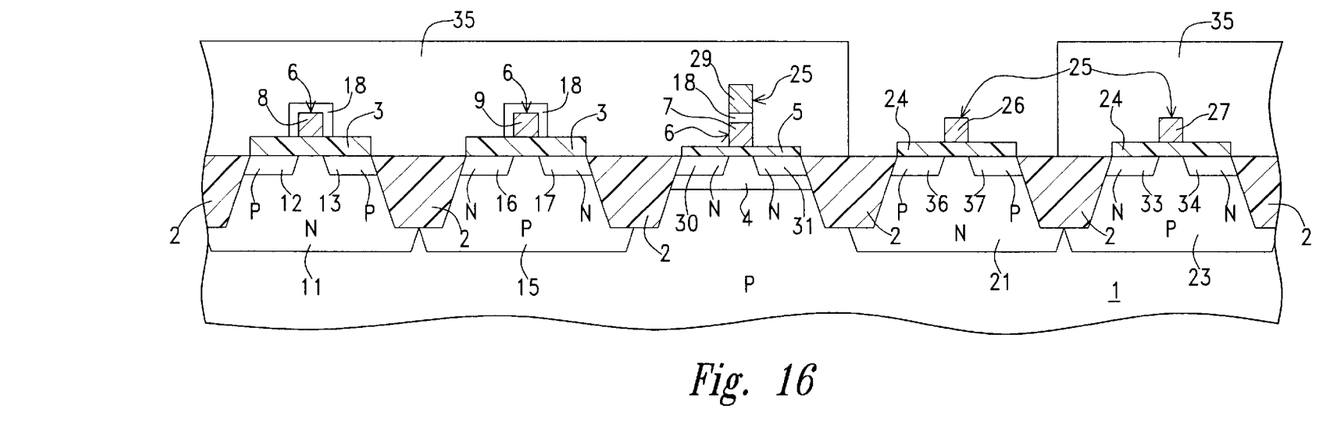

Mask 32 is then removed, and a complementary mask 35 is applied to the chip. Mask 35 leaves uncovered the regions of the chip dedicated to the low-voltage P-channel transistors of the logic circuitry. Similarly, a P type dopant such as B or BF$_2$ is implanted into the low-voltage N type wells 21 to form lightly doped P type source and drain regions 36, 37 (LDD regions) for the low-voltage P-channel transistors of the circuitry. Suitable dose and energy are $1\times10^{13}$–$1\times10^{14}$ at/cm$^2$ (for both B and BF$_2$) and 5–10 KeV for B, or 30–50 KeV for BF$_2$.

After these steps, the resulting structure is that shown in FIG. 16.

Figure 17:
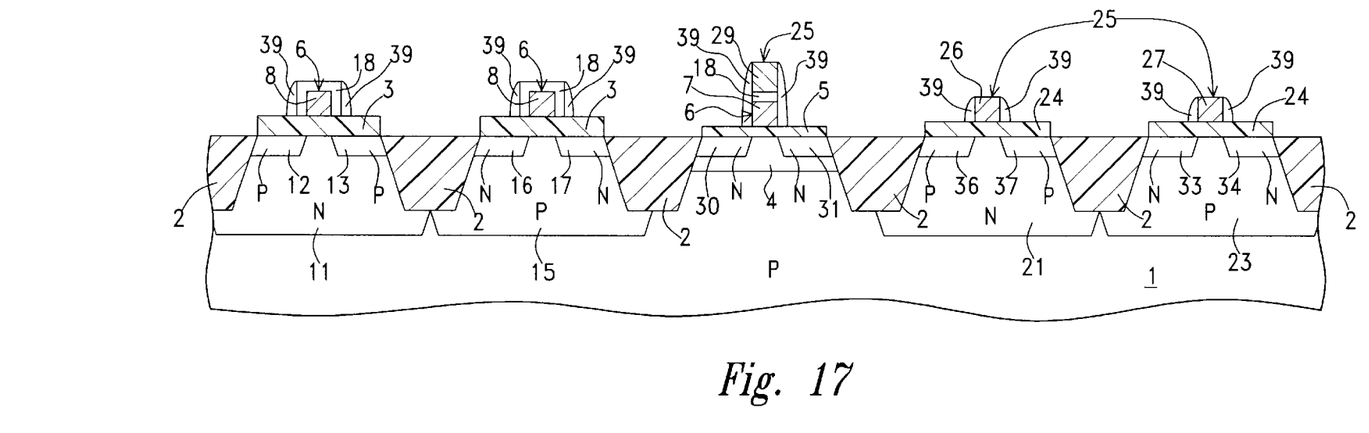

Afterwards, a layer of a dielectric material, such as TEOS, is deposited over the entire chip. The layer of dielectric material is then submitted to an etching process to form sidewall spacers 39 at the sides of all the gate structures, as shown in FIG. 17.

Figure 18:
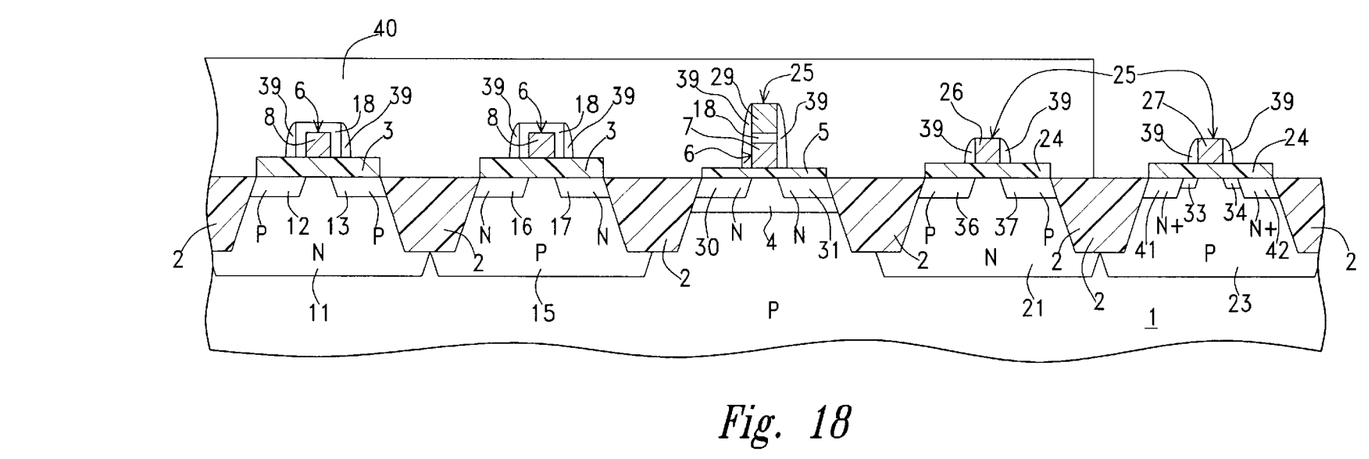

Then a mask 40 is applied to the chip. As shown in FIG. 18, mask 40 leaves uncovered the regions of the chip for the low-voltage N-channel transistors of the logic circuitry. Using mask 40, a relatively heavy dose of an N type dopant such as As is implanted into the low-voltage P type wells 23 to form heavily doped source and drain regions 41, 42 for the low-voltage N-channel transistors of the circuitry. Suitable dose and energy are $1$–$5\times10^{15}$ at/cm$^2$ and 50–120 KeV. After these steps, the resulting structure is that shown in FIG. 18.

Figure 19:
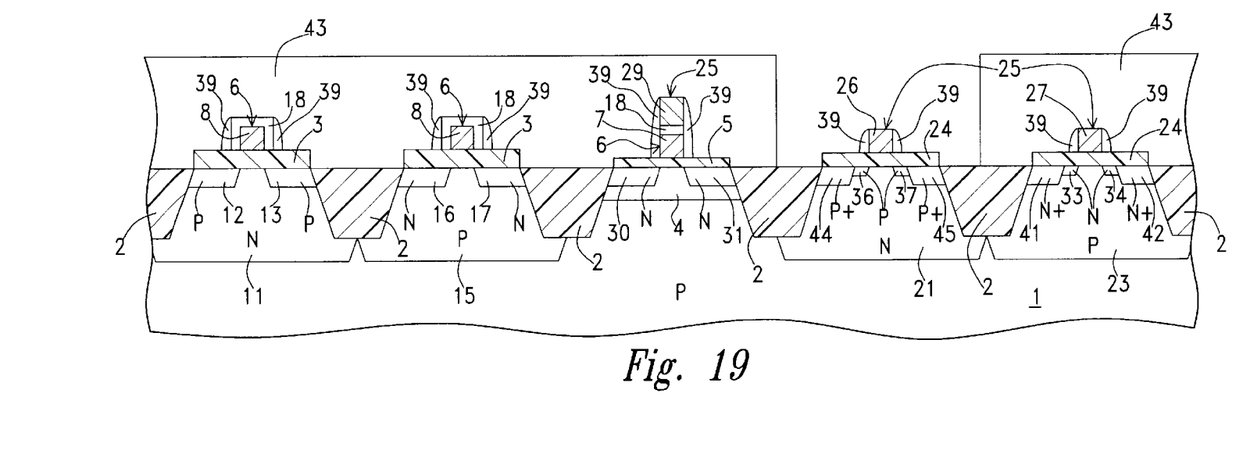

Mask 40 is then removed, and a complementary mask 43 is applied that leaves uncovered the regions of the chip dedicated to the low-voltage P-channel transistors of the logic circuitry. Using mask 43, a relatively heavy dose of a P type dopant such as B is implanted into the low-voltage N type wells 21 to form heavily doped source and drain regions 44, 45 for the low-voltage P-channel transistors of the logic circuitry. Suitable dose and energy are $1$–$5\times10^{15}$ at/cm$^2$ and 5–10 KeV. FIG. 19 shows the structure after these steps.

Figure 20:
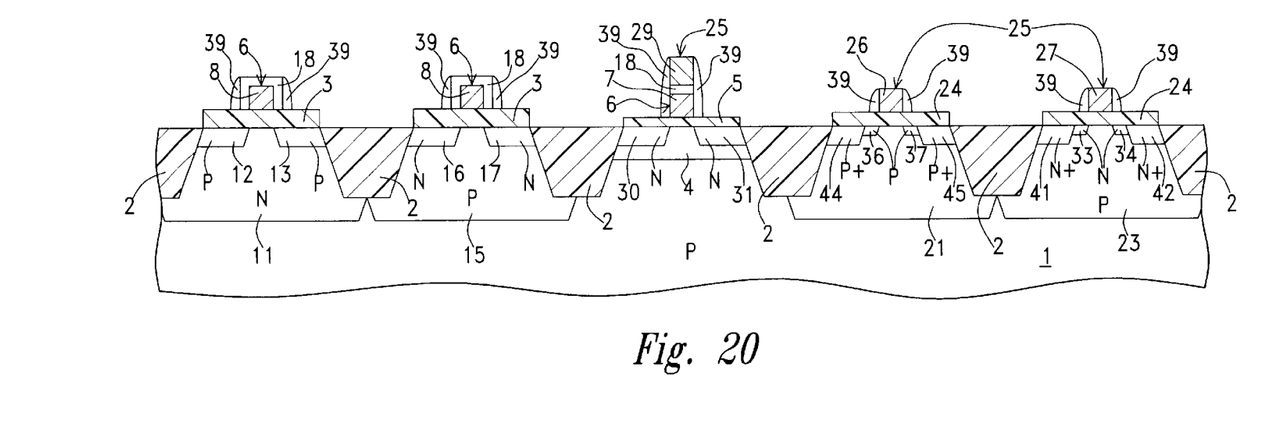

Mask 43 is then removed. The resulting structure is that shown in FIG. 20.

The process goes on with conventional steps, such as back-lapping, rapid thermal processes, salicide formation (with preliminary application of a salicide protection mask), interlevel dielectric formation, contact opening definition, metal deposition and definition etc. etc.

One of the main aspects of the present invention is the use of the same polysilicon layer (the first polysilicon layer) for forming both the floating gates of the memory cells and the gate electrodes of the high-voltage transistors, in the context of a manufacturing process for embedding a memory device in a low-voltage high-performance circuitry. In other words, a same mask is used to define the floating gates of the memory cells and the gate electrodes of the high-voltage transistors. Besides, this approach allows also to separate completely source and drain implants for high-voltage transistors from source and drain implants for low-voltage transistors without any additional extra mask.

The above aspect confers a modular nature to the manufacturing process. The steps for the formation of the memory cells and the high-voltage transistors are grouped together to form a first block of steps, which are carried out first. The steps for the formation of the low-voltage, high-performance circuitry are grouped together to form a second block of steps, which are carried out after the first block of steps. This differs from the conventional processes for the manufacturing of floating-gate non-volatile memory cells, in which the steps for the formation of the memory cells and the high-voltage components are intermixed with the steps for the formation of the low-voltage components.

The block of steps for the formation of the memory cells and the high-voltage components does not depend on the specific technology to be used.

The process according to the present invention allows to easily integrate a memory, particularly a non-volatile memory requiring relatively high voltages, in a process for a low-voltage, high-performance logic circuitry. The integration of the memory requires a minimum of additional masks. For example, in the embodiment previously described, six (seven in the case the buried well is to be provided) additional masks are required for the integration of a memory and the related high-voltage circuitry in a process for a low-voltage circuitry.

It will be apparent to those skilled in the art that the process flow previously described is not the only one that can be devised to implement the invention. Several variations can be contemplated.

The approach according to the invention can be applied whatever the type of memory cell, without any penalty on the memory cell's characteristics (dimensions and performances).

As an alternative to the previously described process, suitable when the memory cells do not require too high voltages, the source and drain regions of the high-voltage transistors could be formed by means of the same masks and implants used to form the source and drain regions for the low-voltage transistors. This means the source and drain regions for the high-voltage transistors will not be formed immediately after the formation of the high-voltage M and P wells (as in FIGS. 5, 6), but later, in the steps shown in FIGS. 15 to 19, modifying the layout of masks 32, 35, 40, 43. Also the high-voltage transistors will have an LDD structure.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit integrated in a same semiconductor chip, comprising low operating voltage high-performance logic circuitry, a memory device operating at a high operating voltage higher than said low operating voltage, and high operating voltage circuitry operating at said high operating voltage, wherein the high operating voltage circuitry comprises a first transistor having a first gate oxide layer with a first thickness, the memory device comprises floating-gate memory cells having a second gate oxide layer with a second thickness, the low operating voltage circuitry comprises second transistors having a third gate oxide layer with a third thickness, and the first transistor has a gate electrode formed from a same polysilicon layer as the one from which a floating-gate electrode of the memory cells is also formed, and the second transistors have a gate electrode formed from a same polysilicon layer as the one from which a control-gate electrode of the memory cells is also formed, wherein the first transistor further includes a dielectric layer that surrounds the gate electrode of the first transistor and contacts a top side and two lateral sides of the gate electrode of the first transistor.

2. The integrated circuit according to claim 1, wherein said first gate oxide layer has a thickness of 100–200 Å, said second gate oxide layer has a thickness of 70–110 Å, and said third oxide layer has a thickness of 40–60 Å.

3. The integrated circuit according to claim 1, further comprising in a first portions of the semiconductor substrate, a high-voltage well regions of a first and a second conductivity type for containing the first transistors.

4. A circuit formed in a semiconductor substrate, comprising:

a high-voltage logic circuit having a first transistor with a first gate oxide region of a first thickness and a first polysilicon gate electrode of a first polysilicon layer wherein the first polysilicon gate electrode is encapsulated by a dielectric layer;

a memory device having a second gate oxide region, a floating gate, a dielectric region and a control gate electrode, wherein the second gate oxide region has a second thickness, and the floating gate is formed of the first polysilicon layer; and a low voltage logic circuit having a second transistor with a third gate oxide region of a third thickness and a second polysilicon gate electrode, the control gate electrode of the memory device and the second polysilicon gate electrode being formed from a second polysilicon layer.

5. The circuit according to claim 4, wherein said first gate oxide region has a thickness of 100–200 Å, said second gate oxide region has a thickness of 70–110 Å, and said third oxide region has a thickness of 40–60 Å.

6. The circuit according to claim 4, wherein the dielectric layer is a triple layer of oxide-nitride-oxide.

7. The circuit according to claim 4, wherein the first transistor further comprises a first side wall spacer formed in contact with and adjacent to the dielectric layer.

8. The circuit according to claim 7, wherein the second transistor further comprises a second side wall spacer in contact with and adjacent to the second polysilicon gate electrode of the low voltage circuit.

9. The circuit according to claim 7, wherein the first polysilicon gate electrode is separated by the dielectric layer from the first side wall spacer.

10. The circuit according to claim 4 wherein the dielectric layer contacts a top side and two lateral sides of the first polysilicon gate electrode.

11. The circuit according to claim 10 wherein the first transistor further comprises side wall spacers formed in contact with the dielectric layer and separated from the two lateral sides of the first polysilicon gate electrode by the dielectric layer.

12. The circuit according to claim 11 wherein the side wall spacers are of a dielectric material that is different from the dielectric layer.

13. The circuit according to claim 10 wherein the dielectric layer has a first end in contact with a first portion of the first gate oxide region at a first side of the first polysilicon gate electrode and a second end in contact with a second portion of the first gate oxide region at a second side of the first polysilicon gate electrode.

14. The integrated circuit according to claim 1 wherein the first transistor further comprises side wall spacers formed in contact with the dielectric layer and separated from the two lateral sides of the gate electrode of the first transistor by the dielectric layer.

15. The integrated circuit according to claim 14 wherein the side wall spacers are of a dielectric material that is different from the dielectric layer.

16. The integrated circuit according to claim 1 wherein the dielectric layer has a first end in contact with a first portion of the first gate oxide layer at a first side of the gate electrode of the first transistor and a second end in contact with a second portion of the first gate oxide region at a second side of the gate electrode of the first transistor.

* * * * *